(12) United States Patent
Ku et al.

(10) Patent No.: US 7,323,907 B1
(45) Date of Patent: Jan. 29, 2008

(54) PRE-EMPHASIS DRIVER CONTROL

(76) Inventors: Ting-Sheng Ku, 3131 Glen Alto Ct., San Jose, CA (US) 95148; Ashfaq R. Shaikh, 2831 Riedel Rd., San Jose, CA (US) 95135

( * ) Notice: Subject to any disclaimer, the term of this patent is extended or adjusted under 35 U.S.C. 154(b) by 105 days.

(21) Appl. No.: 11/292,228

(22) Filed: Nov. 30, 2005

(51) Int. Cl.
*H03K 17/16* (2006.01)
(52) U.S. Cl. .......................................... 326/82; 326/22
(58) Field of Classification Search ................. 326/26, 326/27, 83–87
See application file for complete search history.

(56) References Cited

U.S. PATENT DOCUMENTS

| | | | |
|---|---|---|---|
| 6,393,062 B1 * | 5/2002 | Furman et al. ............. | 375/252 |
| 6,759,868 B2 * | 7/2004 | Helt et al. .................... | 326/30 |
| 6,911,983 B2 * | 6/2005 | Sabella et al. .............. | 345/536 |
| 7,092,312 B2 * | 8/2006 | Choi et al. .................. | 365/233 |
| 7,164,299 B2 * | 1/2007 | Nedachi ..................... | 327/112 |

* cited by examiner

*Primary Examiner*—Don Le
(74) *Attorney, Agent, or Firm*—Berkeley Law and Technology Group, LLP (57) ABSTRACT

Embodiments for controlling pre-emphasis driver circuits for electrical signal interconnects within a computer system are disclosed.

20 Claims, 6 Drawing Sheets

PRE-EMPHASIS DRIVER CONTROL

BACKGROUND

This disclosure is related to pre-emphasis driver control for electrical signal interconnects within a computing platform.

As data transmission rates increase between components within computing platforms and/or other electronic devices, signal integrity issues become more important. One example of a potential signal integrity issue is Inter-Symbol Interference (ISI). ISI may be the result of one or more potential causes of signal degradation. One potential cause may be the attenuation and/or the dispersal of frequency components that may result from signal propagation down a transmission line, for example propagation along a signal trace on a printed circuit board. Another potential cause of ISI may be un-matched termination capacitance and/or relatively heavy capacitive loading at a receiving device. For example, graphics processing devices may interface with memory modules that may comprise a number of memory components, and each of the memory components may add to the capacitive loading on the graphics memory interface. Still another cause may be the potential variations in rise and fall times that may follow varying sequences of ones and zeros (logically high voltage levels and logically low voltage levels, respectively) being driven onto a transmission line. This issue may be referred to as pattern-dependent ISI.

Figure 1:
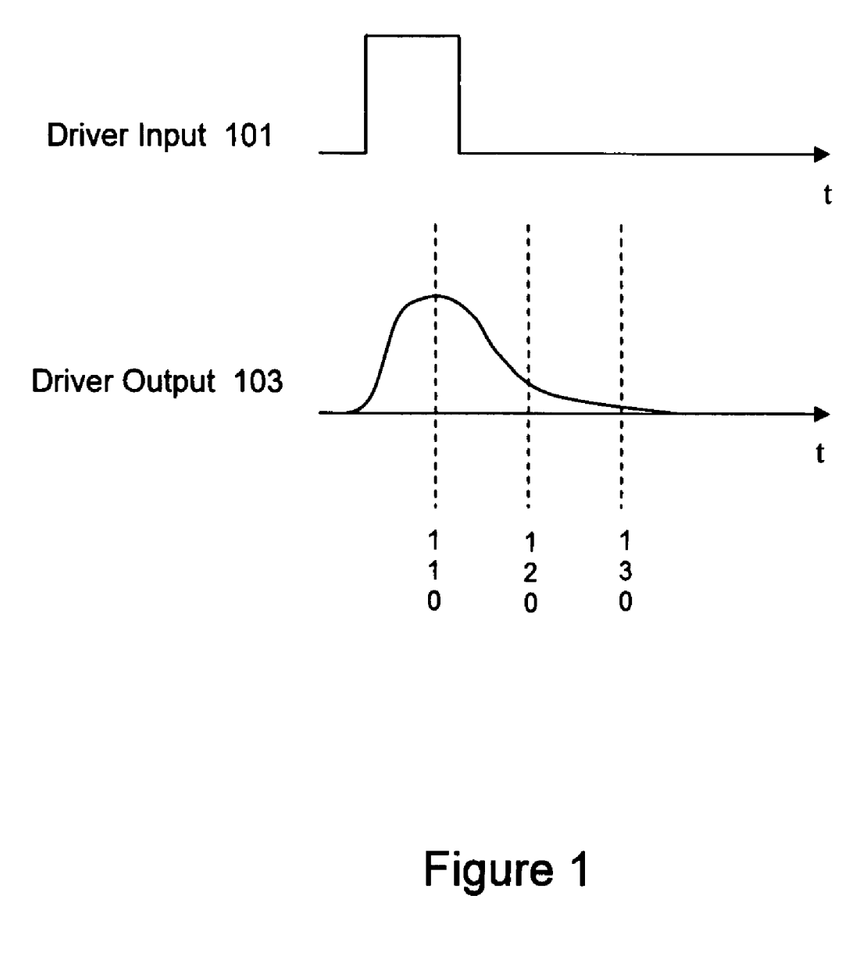
FIG. 1 is a timing diagram depicting potential effects of ISI.

FIG. 1 is a diagram that depicts an example of the potential effects of the issues discussed above. A driver input signal 101 for this example may represent a data signal generated by a logic unit within an integrated circuit device. The data signal may be presented at an input of a driver circuit, and the driver circuit may generate a driver output signal 103. The driver output signal may be coupled to a receiving device via a data interconnect, perhaps a signal trace on a printed circuit board. Because of the characteristics of the driver circuit, the data interconnect, and/or the receiving device (such characteristics may include impedance and/or capacitance and/or other characteristics), the data pulse on driver output signal 103 may differ from the data pulse presented at the driver circuit input 101. As depicted in FIG. 1, the output data pulse on driver output 103 may respond to the aforementioned characteristics with a loss of amplitude, displacement in time, rounded edges, and/or a "smearing" of the pulse into adjacent time slots or unit intervals (perhaps referred to as "bit-times"). At time 110 for this example, the receiving device may sample the value on the driver output signal. One bit-time later, at time 120, the receiving device may again sample the value on driver output signal 103. Because in this example the voltage on driver output 103 has not yet fallen to a logically low voltage level, the value on driver output 103 may be misinterpreted. This smearing of data values into adjacent bit-times is an example of ISI. ISI may result in increased transmission error rates, particularly as data transmission rates increase, thereby limiting data transmission rates and overall computing platform performance.

BRIEF DESCRIPTION OF THE DRAWINGS

Subject matter is particularly pointed out and distinctly claimed in the concluding portion of the specification. Claimed subject matter, however, both as to organization and method of operation, together with objects, features, and advantages thereof, may best be understood by reference of the following detailed description if read with the accompanying drawings in which:

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail so as not to obscure claimed subject matter.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" and/or "an embodiment" in various places throughout this specification are not necessarily all referring to the same embodiment. Furthermore, the particular features, structures, and/or characteristics may be combined in one or more embodiments.

"Logic" as referred to herein relates to structure for performing one or more logical operations. For example, logic may comprise circuitry which provides one or more output signals based at least in part on one or more input signals. Such circuitry may comprise a finite state machine which receives a digital input signal and provides a digital output signal, or circuitry which provides one or more analog output signals in response to one or more analog input signals. Such circuitry may be provided, for example, in an application specific integrated circuit (ASIC) and/or a field programmable gate array (FPGA). Also, logic may comprise machine-readable instructions stored in a storage medium in combination with a processor or other processing circuitry to execute such machine-readable instructions. However, these are merely examples of structures which may provide logic and claimed subject matter is not limited in these respects.

Unless specifically stated otherwise, as apparent from the following discussion, it is appreciated that throughout this specification discussions utilizing terms such as "processing," "computing," "calculating," "selecting," "forming," "enabling," "inhibiting," "identifying," "initiating," "querying," "obtaining," "hosting," "maintaining," "representing," "modifying," "receiving," "transmitting," "storing," "determining" and/or the like refer to the actions and/or processes that may be performed by a computing platform, such as a computer or a similar electronic computing device, that manipulates and/or transforms data represented as physical, electronic and/or magnetic quantities and/or other physical quantities within the computing platform's processors, memories, registers, and/or other information storage, transmission, reception and/or display devices. Accordingly, a computing platform refers to a system or a device that includes the ability to process and/or store data in the form of signals. Thus, a computing platform, in this context, may comprise hardware, software, firmware and/or any combination thereof. Further, unless specifically stated otherwise, a process as described herein, with reference to flow diagrams or otherwise, may also be executed and/or controlled, in whole or in part, by a computing platform.

The term "driver circuit" as used herein is meant to include a wide range of output and/or input/output circuits within any of a wide range of integrated circuit device types. The driver circuits may be configured to provide communication with other integrated circuit devices via a data transfer interconnect. The scope of the claimed subject matter is not limited to any particular driver circuit type, nor is the scope of the claimed subject matter limited to any particular data transfer interconnect type.

The term "pre-emphasis" as used herein is meant to include any technique or method for adding or subtracting amplitude for a period of time to a waveform in order to reduce ISI and/or other signal integrity problems. This may be accomplished in a number of ways, including, but not limited to, increasing the strength of a driver circuit, enabling one or more additional driver circuits (perhaps referred to as pre-emphasis drivers), and/or altering driver circuit impedance. These are merely examples of techniques for accomplishing pre-emphasis, and the scope of the claimed subject matter is not limited in this respect.

The term "bit-time" as used herein may refer to the approximate duration of one data pulse (one bit) on a data signal or data transfer interconnect. For example, a data transfer interconnect with a bit rate of 100 Mbps may have a bit-time of 10 ns. That is, for this example, one bit of data may be transferred across the data transfer interconnect every 10 ns. This is merely an example of a bit-time, and the scope of the claimed subject matter is not limited in this respect.

Figure 2:
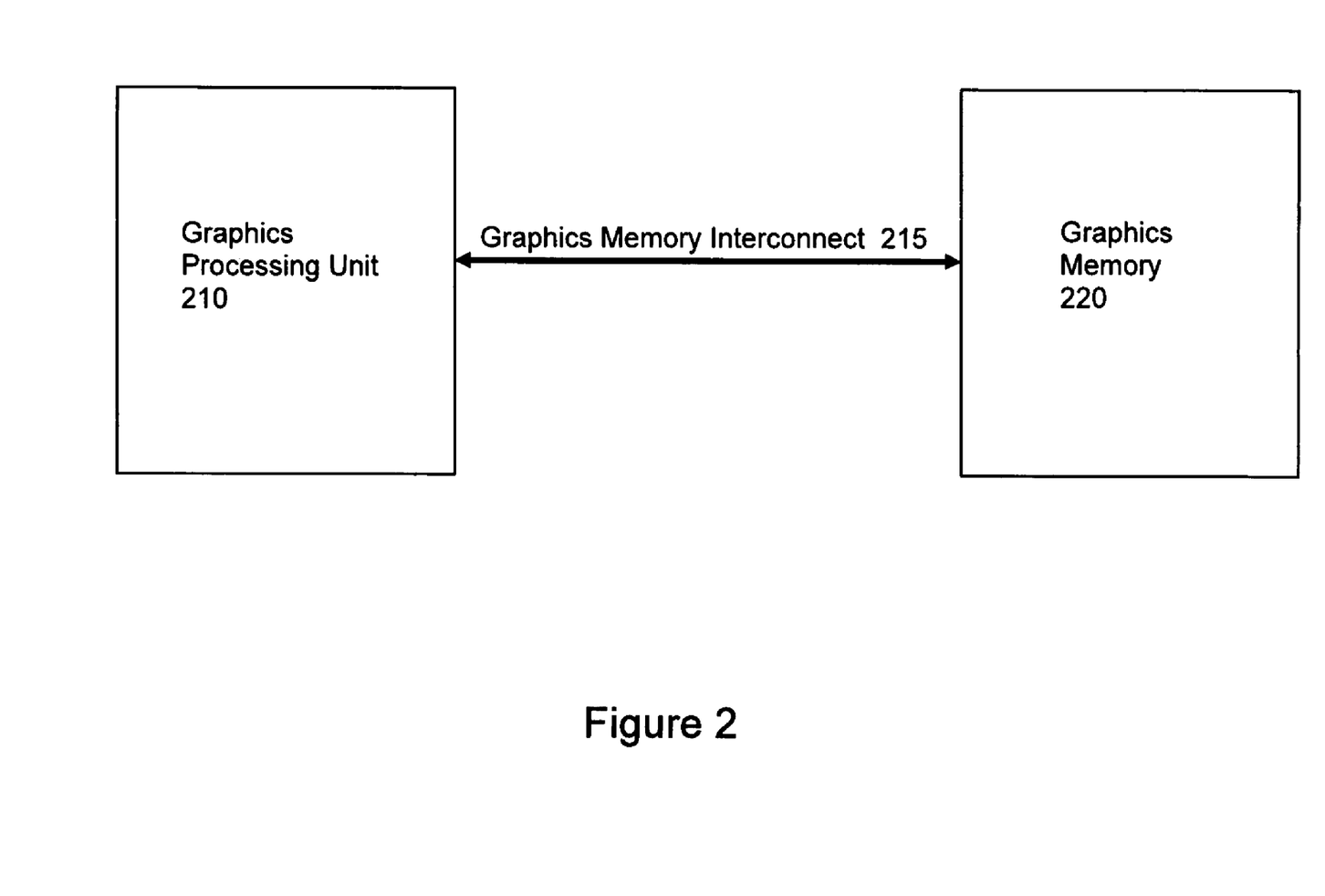
FIG. 2 is a block diagram of an example configuration of a graphics processing unit and a graphics memory.

FIG. 2 is a block diagram of an example configuration of a graphics processing unit (GPU) 210 and a graphics memory 220. GPU 220 and graphics memory 220 are merely examples of integrated circuit devices that may be coupled together via a data transfer interconnect, and the scope of the claimed subject matter is not limited in this respect. For this example, GPU 210 and graphics memory 220 are coupled together via a graphics memory interconnect 215. For one embodiment, graphics memory interconnect 215 may comprise a double data rate (DDR) memory data bus. However, this is merely one example of a data transfer interconnect, and the scope of the claimed subject matter is not limited in this respect.

As used herein, the term "graphics processing unit" is meant to include any device and/or component capable of executing instructions that operate on graphics and/or video data. Graphics processing units may also be capable of communicating display information to a display device. Further, as used herein, the term "graphics memory" is meant to include any memory device, component, and/or memory module (perhaps comprising a number of memory devices) capable of storing graphics and/or video data. One example of a graphics memory may comprise one or more memory devices used as a frame buffer. However, this is merely one example of a graphics memory, and the scope of the claimed subject matter is not limited in this respect.

Figure 3:
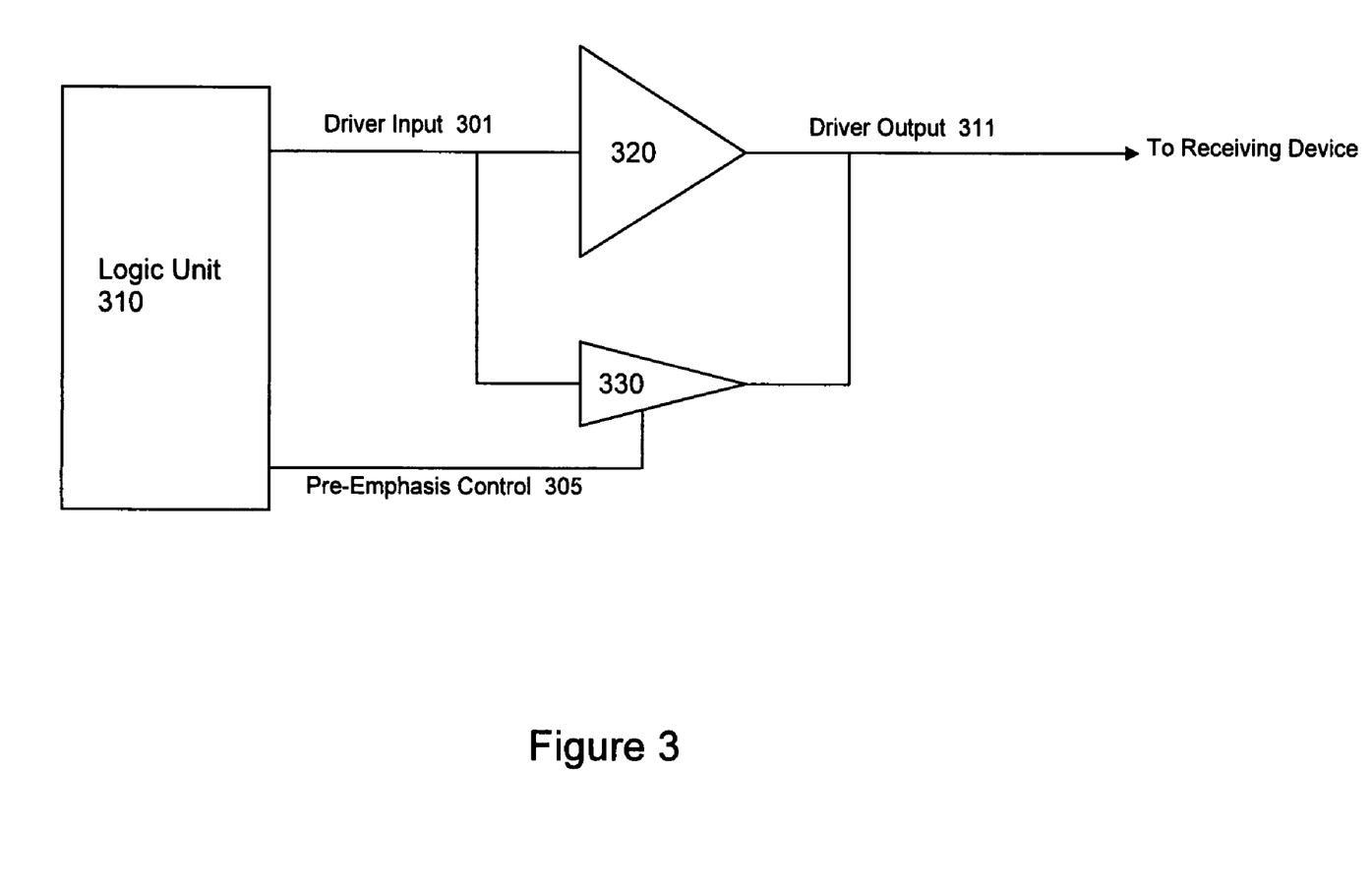
FIG. 3 is a block diagram of an example embodiment of a logic unit coupled to a driver circuit and a pre-emphasis driver circuit.

FIG. 3 is a block diagram of an example embodiment of a logic unit 310 coupled to a driver circuit 320 and a pre-emphasis driver circuit 330. The outputs of driver circuit 320 and/or pre-emphasis driver circuit 330 are coupled to a driver output signal 311. For this example embodiment, logic unit 310 generates a data signal that is delivered to driver input 301. Logic unit 310 also generates a pre-emphasis control signal 305. For this example embodiment, pre-emphasis control signal 305 may be used to enable pre-emphasis driver circuit 330 at appropriate times. For one embodiment, pre-emphasis driver circuit 330 may be enabled for a time period of at least a portion of a bit-time in response to a transition on driver input 301 at a current bit-time from a first logical voltage level to a second logical voltage level if during the previous two bit-times driver input 301 was at the first logical voltage level. However, this is merely an example of how a pre-emphasis driver circuit may be enabled, and the scope of the claimed subject matter is not limited in this respect.

Although this example embodiment describes the driver input and pre-emphasis control signals as being generated by the same logic unit, other embodiments are possible wherein the driver input and pre-emphasis control signals are generated by separate logic units. Also, although the example embodiment of FIG. 3 shows only one pre-emphasis driver circuit, other embodiments are possible using larger numbers of pre-emphasis driver circuits. Further, for some embodiments, the drive strength of the pre-emphasis driver circuit may be programmable. Also, the period of time during which the pre-emphasis driver circuit is enabled may be programmable for some embodiments.

For one embodiment, driver circuit 320 and pre-emphasis driver 330 may be capable of incorporating four voltage levels. For example, driver circuit 320 alone may be capable of outputting a normal high voltage level and/or a normal low voltage level. Driver circuit 320 and pre-emphasis driver circuit 330 together may be capable of outputting a strong high voltage level and/or a strong low voltage level. For other embodiments, greater numbers of voltage levels may be incorporated.

For one example embodiment, the circuitry described above in connection with FIG. 3 may be implemented in a graphics processing unit. In another embodiment, the circuitry described above in connection with FIG. 3 may be implemented in a graphics memory. However, these are merely examples of devices and/or components that may comprise such circuitry, and the scope of the claimed subject matter is not limited in this respect.

Driver output signal 311 may be coupled to a receiving device. The receiving device may comprise any of a wide range of electronic devices and/or components. For one embodiment, the receiving device may comprise a graphics memory. For another embodiment, the receiving device may comprise a graphics processing unit. However, these are merely examples of devices and/or components that may receive a driver output signal, and the scope of the claimed subject matter is not limited in this respect.

Figure 4:
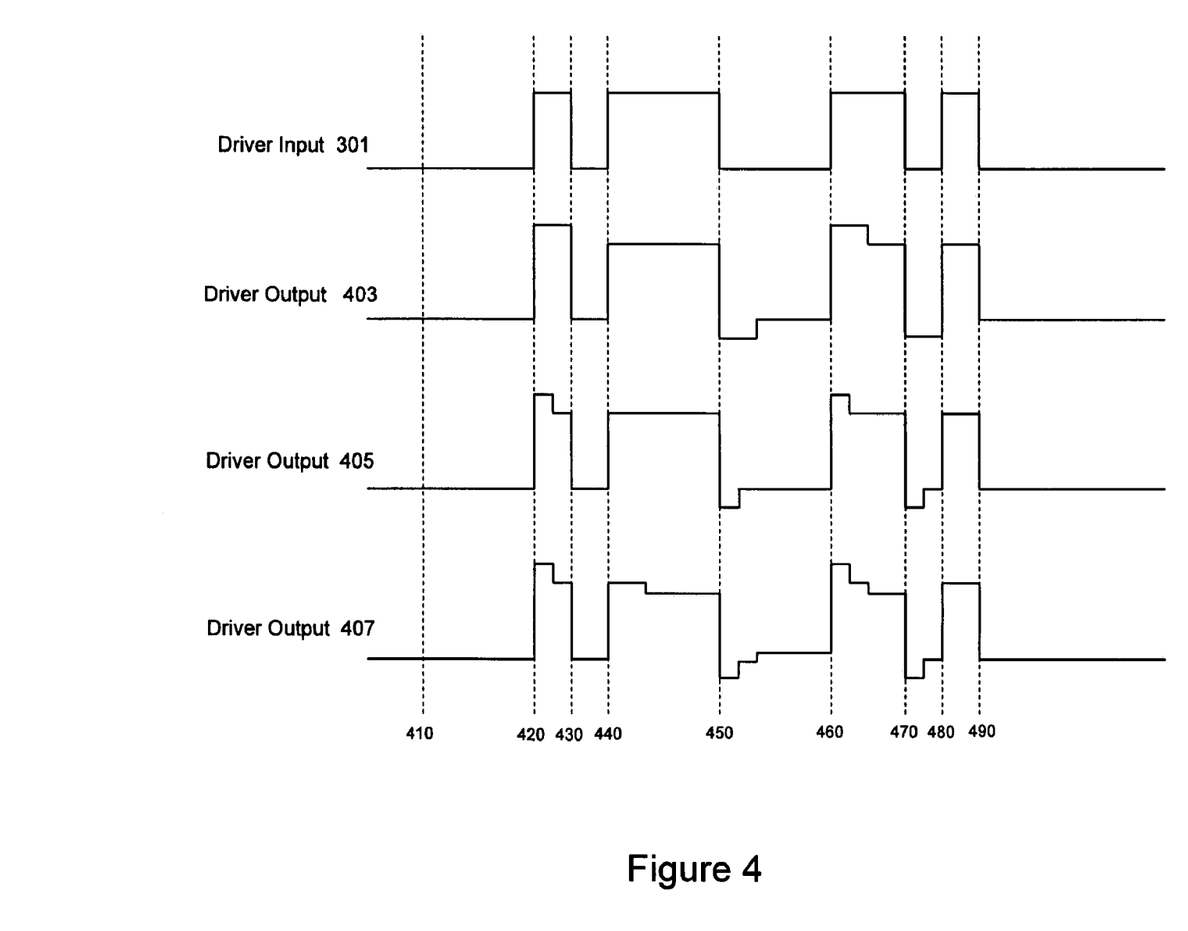
FIG. 4 is a timing diagram depicting an example data stream delivered to a driver input and further depicting example waveforms representing example driver strength values over time.

FIG. 4 is a timing diagram depicting an example data stream delivered to a driver input and further depicting example waveforms representing example driver strength values over time. The example driver strengths for this figure are expressed as voltage levels. The driver input waveform 301 for this example represents a data stream delivered over time to the inputs of driver circuit 320 and pre-emphasis driver 330. The driver output waveforms 403, 405, and 407 represent separate examples of voltage levels output by driver circuit 320, pre-emphasis driver 330, or a combination of driver circuits 320 and 330. The driver output waveforms 403, 405, and 407 for this timing diagram are idealized, and are shown for example purposed only. Actual waveforms may differ from those depicted in FIG. 4.

The driver output 403 example will now be discussed. Driver input signal 301 at time 410 is at a logically low voltage level. It remains at the logically low voltage level until time 420. At time 420, driver input signal 301 transitions from the logically low voltage level to a logically high voltage level. In response to the transition on driver input 301 and because driver input 301 was at the logically low voltage level for two or more bit-times, driver output 403 transitions from a normal low voltage level to a strong high voltage level. Driver input 301 transitions from the logically high voltage level to the logically low voltage level at time 430. Because driver input 301 was not at the logically high voltage level for two or more bit-times, no pre-emphasis is applied at time 430 and driver output 403 returns to the normal low voltage level.

At time 440, driver input 301 transitions from the logically low voltage level to the logically high voltage level. Because driver input 301 was not at the logically low voltage level for two or more bit-times (the interval between time 430 and 440 represents one bit-time), no pre-emphasis is applied and driver output 403 is driven to a normal high voltage level. Driver input 301 remains at the logically high voltage level for a period of several bit-times, and at time 450 driver output 301 transitions from the logically high voltage level to the logically low voltage level. Because driver input 301 was at the logically high voltage level for two or more bit-times, pre-emphasis is applied and driver output 403 is driven to a strong low voltage level. For this example, driver output 403 is driven to the strong low voltage level for the period of one bit-time. At the end of that bit-time, because driver input 301 remains at the logically low voltage level, driver output 403 is driven to the normal low voltage level.

At time 460, driver input 301 transitions from the logically low voltage level to the logically high voltage level. Because driver input 301 was at the logically low voltage level for two or more bit-times, pre-emphasis is applied and driver output 403 is driven to the strong high voltage level for the period of one bit-time. At the end of that bit-time, because driver input 301 remains at the logically high voltage level, driver output 403 is driven to the normal high voltage level.

At time 470, driver input 301 transitions from the logically high voltage level to the logically low voltage. Because driver input 301 was at the logically high voltage for two or more bit-times, pre-emphasis is added and driver output 403 is driven to the strong low voltage level. At time 480, driver input 301 transitions from the logically low voltage level to the logically high voltage level. Because driver input 301 was not at the logically low voltage for two or more bit-times, no pre-emphasis is added and driver output 403 is driven to the normal high voltage level. At time 490, driver input 301 transitions from the logically high voltage level to the logically low voltage level. Because driver input 301 was not at the logically high voltage for two or more bit-times, no pre-emphasis is added and driver output 403 is driven to the normal low voltage level.

The driver output 405 example will now be discussed. For this example, whenever pre-emphasis is applied, it is applied for only a portion of a bit-time. For one embodiment, whenever pre-emphasis is applied it is applied for an early portion of a bit-time to help with a transition from one logical voltage level to another logical voltage level. This early portion of the bit-time may be referred to as a transition period.

Driver input signal 301 at time 410 is at a logically low voltage level. It remains at the logically low voltage level until time 420. At time 420, driver input signal 301 transitions from the logically low voltage level to a logically high voltage level. In response to the transition on driver input 301 and because driver input 301 was at the logically low voltage level for two or more bit-times, driver output 405 transitions from the normal low voltage level to the strong high voltage level. A portion of a bit-time later, driver output 405 is driven to the normal high voltage level. Driver input 301 transitions from the logically high voltage level to the logically low voltage level at time 430. Because driver input 301 was not at the logically high voltage level for two or more bit-times, no pre-emphasis is applied at time 430 and driver output 405 returns to the normal low voltage level.

At time 440, driver input 301 transitions from the logically low voltage level to the logically high voltage level. Because driver input 301 was not at the logically low voltage level for two or more bit-times, no pre-emphasis is applied and driver output 405 is driven to the normal high voltage level. Driver input 301 remains at the logically high voltage level for a period of several bit-times, and at time 450 driver output 301 transitions from the logically high voltage level to the logically low voltage level. Because driver input 301 was at the logically high voltage level for two or more bit-times, pre-emphasis is applied and driver output 405 is driven to the strong low voltage level. For this example, driver output 405 is driven to the strong low voltage level for the period of a portion of one bit-time. At the end of that portion of a bit-time, driver output 405 is driven to the normal low voltage level.

At time 460, driver input 301 transitions from the logically low voltage level to the logically high voltage level. Because driver input 301 was at the logically low voltage level for two or more bit-times, pre-emphasis is applied and driver output 405 is driven to the strong high voltage level for a portion of a bit-time. After that portion of the bit-time, driver output 405 is driven to the normal high voltage level.

At time 470, driver input 301 transitions from the logically high voltage level to the logically low voltage. Because driver input 301 was at the logically high voltage level for two or more bit-times, pre-emphasis is added and driver output 405 is driven to the strong low voltage level for a period of a portion of a bit-time. After the portion of a bit-time, driver output 405 is driven to the normal low voltage level. At time 480, driver input 301 transitions from the logically low voltage level to the logically high voltage level. Because driver input 301 was not at the logically low voltage for two or more bit-times, no pre-emphasis is added and driver output 405 is driven to the normal high voltage level. At time 490, driver input 301 transitions from the logically high voltage level to the logically low voltage level. Because driver input 301 was not at the logically high voltage for two or more bit-times, no pre-emphasis is added and driver output 405 is driven to the normal low voltage level.

The driver output 407 example will now be discussed. For this example, whenever pre-emphasis is applied, it is applied for only a portion of a bit-time. For one embodiment, whenever pre-emphasis is applied it is applied for an early portion of a bit-time to help with a transition from one logical voltage level to another logical voltage level. This early portion of the bit-time may be referred to as a transition period. Also for this example, six driver output voltage levels are implemented. In addition to the normal high, strong high, strong low, and normal low voltage levels, driver circuit 320, pre-emphasis driver circuit 330, or a combination of driver circuits 320 and 330 may be capable of driving driver output signal 407 to a weak high voltage and a weak low voltage level.

Driver input signal 301 at time 410 is at a logically low voltage level. It remains at the logically low voltage level until time 420. At time 420, driver input signal 301 transitions from the logically low voltage level to a logically high voltage level. In response to the transition on driver input 301 and because driver input 301 was at the logically low voltage level for two or more bit-times, driver output 407 transitions from the normal low voltage level to the strong high voltage level. A portion of a bit-time later, driver output 407 is driven to the normal high voltage level. Driver input 301 transitions from the logically high voltage level to the logically low voltage level at time 430. Because driver input 301 was not at the logically high voltage level for two or more bit-times, no pre-emphasis is applied at time 430 and driver output 407 returns to the normal low voltage level.

At time 440, driver input 301 transitions from the logically low voltage level to the logically high voltage level. Because driver input 301 was not at the logically low voltage level for two or more bit-times, no pre-emphasis is applied and driver output 407 is driven to the normal high voltage level. One bit-time later, driver output 407 is driven to the weak high voltage level. Although this example describes transitioning to the weak high voltage level after one bit-time, other embodiments may transition to the weak high voltage level at other intervals.

Driver input 301 remains at the logically high voltage level for a period of several bit-times, and at time 450 driver output 301 transitions from the logically high voltage level to the logically low voltage level. Because driver input 301 was at the logically high voltage level for two or more bit-times, pre-emphasis is applied and driver output 407 is driven to the strong low voltage level. For this example, driver output 407 is driven to the strong low voltage level for the period of a portion of one bit-time. At the end of that portion of a bit-time, driver output 405 is driven to the normal low voltage level. For this example, one bit-time following the transition to the strong low voltage at time 450, driver output 407 is driven to a weak low voltage level. For other embodiments, the transition to the weak low voltage level may occur at different intervals.

At time 460, driver input 301 transitions from the logically low voltage level to the logically high voltage level. Because driver input 301 was at the logically low voltage level for two or more bit-times, pre-emphasis is applied and driver output 407 is driven to the strong high voltage level for a portion of a bit-time. After that portion of the bit-time, driver output 407 is driven to the normal high voltage level. One bit-time following the transition at time 460, driver output 407 is driven to the weak high voltage level.

At time 470, driver input 301 transitions from the logically high voltage level to the logically low voltage. Because driver input 301 was at the logically high voltage for two or more bit-times, pre-emphasis is added and driver output 407 is driven to the strong low voltage level for a period of a portion of a bit-time. After the portion of a bit-time, driver output 407 is driven to the normal low voltage level. At time 480, driver input 301 transitions from the logically low voltage level to the logically high voltage level. Because driver input 301 was not at the logically low voltage for two or more bit-times, no pre-emphasis is added and driver output 407 is driven to the normal high voltage level. At time 490, driver input 301 transitions from the logically high voltage level to the logically low voltage level. Because driver input 301 was not at the logically high voltage for two or more bit-times, no pre-emphasis is added and driver output 407 is driven to the normal low voltage level.

Figure 5:
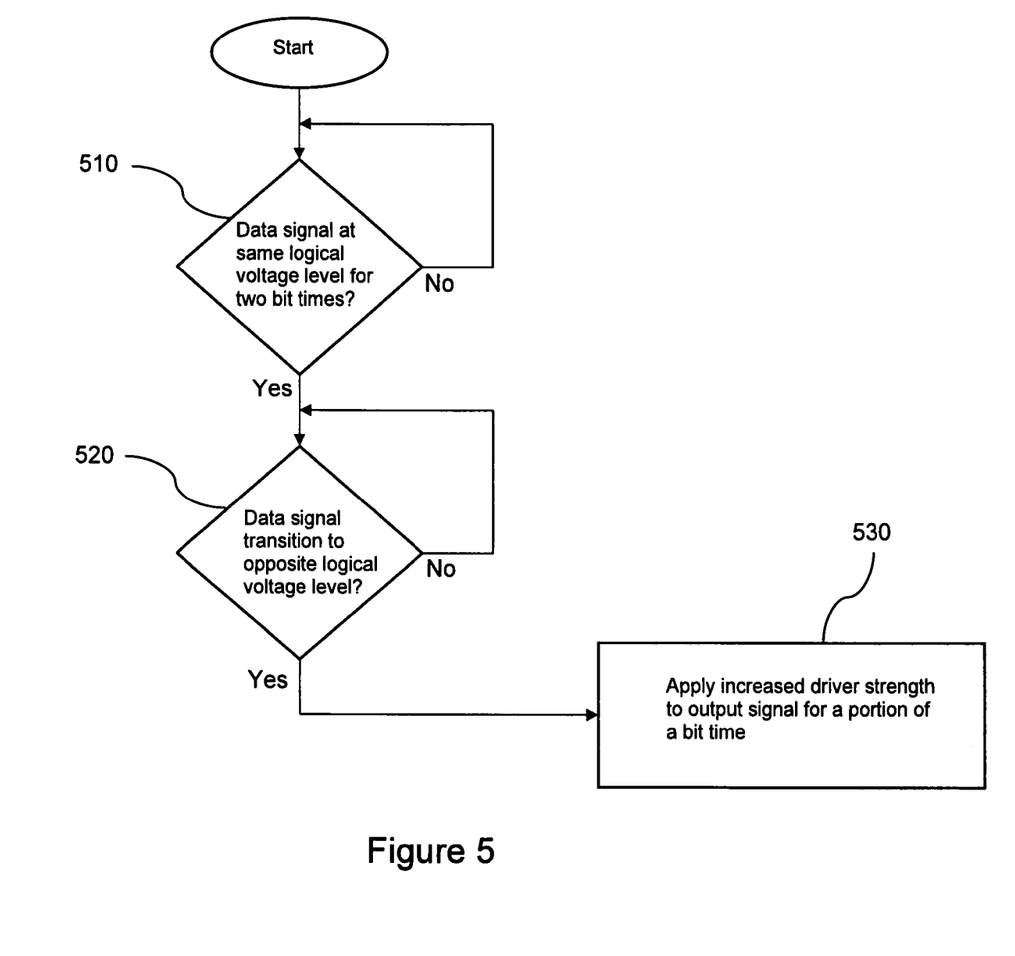
FIG. 5 is a flow diagram of an example embodiment of a method for controlling a pre-emphasis driver circuit.

FIG. 5 is a flow diagram of an example embodiment of a method for controlling a pre-emphasis driver circuit. At block 510, a determination is made as to whether a data signal received at an input to a driver circuit has been at the same logical voltage level for two bit-times. If the determination is made that the data signal has been at the same logical voltage for two bit-times, at block 520 a determination is made as to whether there is a transition of the data signal to the opposite logical voltage level. If a transition to the opposite logical voltage occurs, at block 530 an increased driver strength is applied for a portion of a bit time. An embodiment in accordance with claimed subject matter may include all, more than all or less than all of blocks 510-530. Furthermore, the order of blocks 510-530 is merely an example order, and the scope of the claimed subject matter is not limited in this respect.

Figure 6:
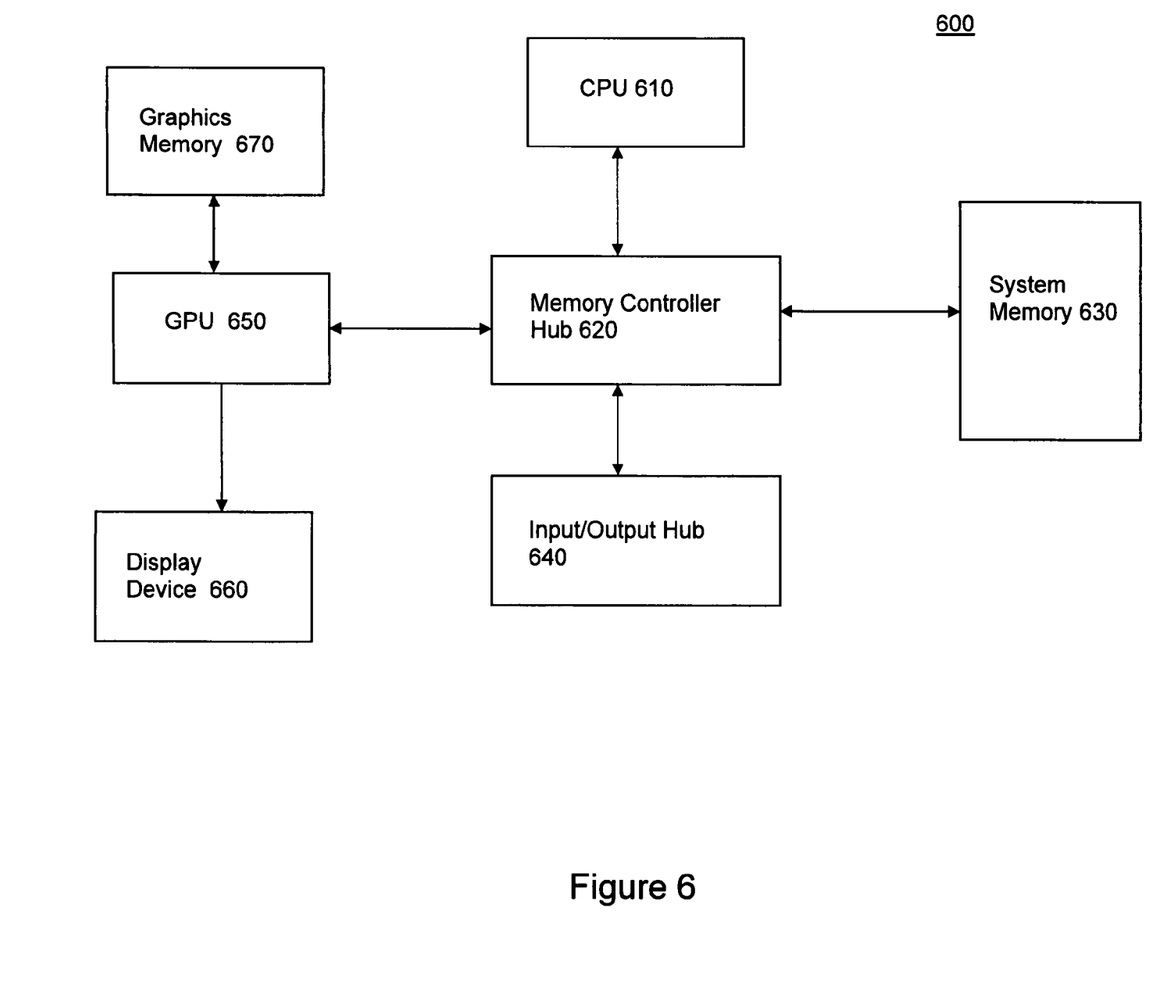
FIG. 6 is a block diagram of an example embodiment of a computing platform.

FIG. 6 is a block diagram of an example embodiment of a computing platform 600. Computing platform 600 includes a CPU 610 and a memory controller hub 620 coupled to CPU 610. Memory controller hub 620 is further coupled to a system memory 630, to a GPU 650, and to an input/output hub 640. GPU 650 is further coupled to a display device 660, which may comprise a CRT display, a flat panel LCD display, or other type of display device. Also coupled to GPU 650 is a graphics memory 670. For this example embodiment, graphics memory 670 may be coupled to GPU 650 via a DDR (double data rate) interface. GPU 650 may comprise circuitry similar to that discussed above in connection with FIG. 3.

Although the example platform 600 is described with pre-emphasis circuitry included in GPU 650, other embodiments may include pre-emphasis circuitry in other components within the platform. That is, any of the components of computing platform 600 may comprise pre-emphasis circuitry configured in accordance with the example embodiments described herein. Further, although the data transfer interconnects described herein are used to couple various components in a computing platform, other embodiments may include data transfer interconnects used for intra-chip data transfers, and still other embodiments are possible that may include data transfer interconnects between different integrated circuit dice that may share a package.

Although example system 600 is shown with a particular configuration of components, other embodiments are possible using any of a wide range of configurations. Further, the example embodiments described herein may be utilized in any of a wide range of electronic devices, including, but not limited to, computing platforms, gaming devices, cellular phones, personal digital assistants, music players, communications network components, etc.

In the preceding description, various aspects of claimed subject matter have been described. For purposes of explanation, systems and configurations were set forth to provide a thorough understanding of claimed subject matter. However, it should be apparent to one skilled in the art having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

The invention claimed is:

1. An apparatus, comprising:
    a driver circuit including an input terminal and an output terminal, the output terminal adapted to transmit an output signal;
    a logic unit adapted to transmit a data signal to the input terminal of the driver circuit; and
    a pre-emphasis driver adapted to apply an increased driver strength to the output signal for a portion of a bit time in response to the data signal remaining at a first logical voltage level for approximately two or more bit times and the data signal subsequently transitioning from the first logical voltage level to a second logical voltage level, the pre-emphasis driver further adapted to not apply the increased driver strength to the output signal in response to the data signal remaining at the first logical voltage level for less than approximately two bit times prior to said transitioning from the first logical voltage level to the second logical voltage level.

2. The apparatus of claim 1, wherein the apparatus comprises a graphics processing unit.

3. The apparatus of claim 1, wherein the apparatus comprises a graphics memory device.

4. The apparatus of claim 1, wherein the driver circuit is adapted to apply a reduced driver strength to the output signal if after said transition from the first logical voltage level to the second logical voltage level the output signal remains at the second logical voltage level for more than approximately one bit time.

5. The apparatus of claim 1, wherein the duration of the increased driver strength comprises a programmable value.

6. The apparatus of claim 1, wherein the amplitude of the increased driver strength comprises a programmable value.

7. A system, comprising:
    a receiving device; and
    a transmitting device coupled to the receiving device via an interconnect, the transmitting device comprising:
        a driver circuit including an input terminal and an output terminal coupled to the interconnect, wherein the output terminal is adapted to transmit an output signal;
        a logic unit adapted to transmit a data signal to the input terminal of the driver circuit; and
        a pre-emphasis driver adapted to apply an increased driver strength to the output signal in response to the data signal remaining at a first logical voltage level for approximately two or more bit times and the data signal subsequently transitioning from the first logical voltage level to a second logical voltage level, the pre-emphasis driver being further adapted to not apply the increased driver strength to the output signal in response to the data signal remaining at the first logical voltage level for less than approximately two bit times prior to said transitioning from the first logical voltage level to the second logical voltage level.

8. The system of claim 7, wherein the transmitting device comprises a graphics processing unit and the receiving device comprises a graphics memory device.

9. The system of claim 7, wherein the pre-emphasis driver is adapted to apply the increased driver strength for a programmable period of time.

10. The system of claim 7, wherein the driver circuit is adapted to apply a reduced driver strength to the output signal if after said transition from the first logical voltage level to the second logical voltage level the output signal remains at the second logical voltage level for more than approximately one bit time.

11. The system of claim 7, wherein the amplitude of the increased driver strength comprises a programmable value.

12. A method, comprising:
    transmitting a data signal from a logic unit to an input terminal of a driver circuit, wherein the driver circuit further comprises an output terminal adapted to transmit an output signal; and
    applying an increased driver strength to the output signal of the driver circuit for a portion of a bit time in response to the data signal remaining at a first logical voltage level for approximately two or more bit times and the data signal subsequently transitioning from the first logical voltage level to a second logical voltage level, wherein the increased driver strength is not applied to the output signal in response to the data signal remaining at the first logical voltage level for less than approximately two bit times prior to said transitioning from the first logical voltage level to the second logical voltage level.

13. The method of claim 12, wherein said transmitting the data signal from the logic unit to the input terminal of the driver circuit comprises transmitting a data signal from a logic unit within a graphics processing unit to a driver circuit within the graphics processing unit.

14. The method of claim 13, wherein the output terminal is coupled to a graphics memory device.

15. The method of claim 12, wherein said transmitting the data signal from the logic unit to the input terminal of the driver circuit comprises transmitting a data signal from a logic unit within a graphics memory device to a driver circuit within the graphics memory device.

16. The method of claim 15, wherein the output terminal is coupled to a graphics processing unit.

17. The method of claim 12, wherein said applying the increased driver strength to the output signal comprises applying the increased driver strength for a programmable period of time.

18. The method of claim 12, further comprising:
    applying a reduced driver strength to the output signal if after said transitioning from the first logical voltage level to the second logical voltage level the output signal remains at the second logical voltage level for more than approximately one bit time.

19. The method of claim 12, wherein said applying the increased driver strength to the output signal comprises applying the increased driver strength with a programmable amplitude.

20. An apparatus, comprising:
    means for transmitting a data signal from a logic unit to a driver circuit; and
    means for applying an increased driver strength to an output signal of the driver circuit for a portion of a bit time in response to the data signal remaining at a first logical voltage level for approximately two or more bit times and the data signal subsequently transitioning from the first logical voltage level to a second logical voltage level, wherein the increased driver strength is not applied to the output signal in response to the data signal remaining at the first logical voltage level for less than approximately two bit times prior to said transitioning from the first logical voltage level to the second logical voltage level.

* * * * *